(12) United States Patent
Bakker

(10) Patent No.: US 7,405,804 B2
(45) Date of Patent: Jul. 29, 2008

(54) LITHOGRAPHIC APPARATUS WITH ENHANCED SPECTRAL PURITY, DEVICE MANUFACTURING METHOD AND DEVICE MANUFACTURED THEREBY

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 227 days.

(21) Appl. No.: 10/958,666

(22) Filed: Oct. 6, 2004

(65) Prior Publication Data

US 2006/0072090 A1 Apr. 6, 2006

(51) Int. Cl.
G03B 27/42 (2006.01)
G03B 27/54 (2006.01)
(52) U.S. Cl. .................................. 355/53; 355/67
(58) Field of Classification Search .......... 355/50, 355/57, 63, 60, 67, 53, 55; 250/548; 356/399–401
See application file for complete search history.

(56) References Cited

U.S. PATENT DOCUMENTS 6,469,827 B1 * 10/2002 Sweatt et al. ............... 359/351
6,498,351 B1 * 12/2002 Kruizinga et al. .......... 250/492.2
2004/0227103 A1 * 11/2004 Singer et al. ............... 250/492.1
2006/0001854 A1 * 1/2006 Singer et al. ................ 355/67

FOREIGN PATENT DOCUMENTS

WO WO 2004/021085 A1 * 3/2004

* cited by examiner

*Primary Examiner*—Hung Henry Nguyen
(74) *Attorney, Agent, or Firm*—Pillsbury Winthrop Shaw Pittman, LLP

(57) ABSTRACT

A lithographic apparatus includes an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein the radiation beam is reflected from at least one grazing incidence mirror that enhances the spectral purity of the radiation beam.

30 Claims, 6 Drawing Sheets

LITHOGRAPHIC APPARATUS WITH ENHANCED SPECTRAL PURITY, DEVICE MANUFACTURING METHOD AND DEVICE MANUFACTURED THEREBY

BACKGROUND OF THE INVENTION

1. Field of the Invention

The present invention relates to a lithographic apparatus and a method of using the apparatus in the manufacture of a device such as an integrated circuit (IC). In particular, the present invention relates to a lithographic apparatus designed to be used with radiation having a wavelength in the Extreme Ultra-Violet (EUV) range and wherein the lithographic apparatus is designed to provide a radiation beam with enhanced spectral purity.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that use, a patterning device, which may alternatively be referred to as a mask or a reticle, may be used to generate a circuit pattern to be formed on an individual layer of the IC. This pattern can be transferred onto a target portion (e.g. including part of one, or several, dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction, the "scanning" direction, while synchronously scanning the substrate parallel or anti-parallel to this direction. It is also possible to transfer the pattern from the patterning device to the substrate by imprinting the pattern onto the substrate.

Between the reticle and the substrate is disposed a projection system for imaging the irradiated portion of the reticle onto the target portion of the substrate. The projection system includes components for directing, shaping or controlling the projection beam of irradiation, and these components typically include refractive optics, reflective optics, and/or catadioptric systems, for example.

An important feature in lithography is the size of features of the pattern applied to the substrate. It is desirable to produce apparatus capable of resolving features as small and close together as possible. A number of parameters affect the available resolution of features, and one of these features is the wavelength of the radiation used to expose the pattern.

It is anticipated that the use of EUV lithography will enable the manufacture of feature sizes down to 32 mm using radiation with an EUV wavelength between 5 and 20 nm, and typically 13.5 nm. Radiation at this wavelength is absorbed in all materials and is therefore not suitable for use with refractive optics. The optics in a projection system for use with EUV lithography must therefore be based on reflective elements, for example mirrors, which can only operate in an Ultra-High-Vacuum (UHV) environment. The projection system is therefore enclosed in a Projection Optics Box (POB) which is kept under a vacuum.

However, a significant difficulty in EUV lithography is designing a system which has a projection beam with high spectral purity.

For example, some EUV sources, especially plasma sources, emit radiation over a wide range of frequencies, even including infra red (IR) visible (VIS), ultra-violet (UV) and deep ultra-violet (DUV). These undesired frequencies will propagate and cause heating problems in the illumination and projection systems and cause undesired exposure of the resist if not blocked. In addition, although the multi-layered mirrors of illumination and projection systems are optimized for reflection of the desired wavelength, e.g. 13.5 nm, they are optically flat and have quite high reflectivities at IR, VIS and UV wavelengths. It is therefore necessary to select from the source a relatively narrow band of frequencies for the beam of radiation. Even where the source has a relatively narrow emission line which contains a large part of the energy, it is necessary to reject radiation out of that line, especially at longer wavelengths. Previously, it has been proposed to use a thin membrane as a filter to perform this function. However, such a film is very delicate and becomes very hot, 200-300° C. or more, leading to high thermal stresses and cracking, sublimation and oxidation in the high power levels necessary in a lithographic projection apparatus. A membrane filter also generally absorbs at least 50% of the desired radiation.

Furthermore, U.S. Pat. No. 6,678,037, incorporated herein by reference, describes a lithographic projection apparatus wherein a grating spectral filter is used in the radiation system of the lithographic projection apparatus. The grating spectral filter in U.S. Pat. No. 6,678,037 is designed for allowing radiation of desired wavelengths to form a beam of radiation and for deflecting radiation of undesired wavelengths. The grating spectral filter is substantially formed of a material having a complex refractive index close to unity at the desired wavelengths and includes silicon protrusions. The protrusions have a laminar sawtooth profile or a laminar square wave profile and are present on a mirror, having a mirroring surface. Additionally, the filter in U.S. Pat. No. 6,678,037 is silicon and does not block IR radiation very well.

SUMMARY OF THE INVENTION

It is an aspect of the present invention to provide a lithographic apparatus which increases the proportion of EUV radiation in a conditioned beam thereby providing enhanced spectral purity.

According to an embodiment of the present invention, a lithographic apparatus includes an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein the radiation beam is reflected from at least one grazing incidence mirror that enhances the spectral purity of the radiation beam By enhancing the spectral purity, the proportion of EUV radiation in the radiation beam is increased. The proportion of EUV radiation to, for example, IR radiation is therefore increased by reflecting the radiation beam from a grazing incidence mirror.

Grazing incidence mirrors may show significant polarization dependence in their reflection coefficients. In particular, the reflectance of grazing incidence mirrors may be polarization dependent for non-EUV radiation. For non-EUV radiation, the reflectance of p-polarized light may be less than s-polarized light. This effect may be used for increasing the spectral purity of a radiation beam. By selecting the proper orientation of the grazing incidence mirrors, the spectral purity may be enhanced. Grazing, typically means an angle of incidence measured with respect to the surface of a mirror of about 0-30°.

Typically, the lithographic apparatus includes an optical train and the spectral purity of the radiation beam may be enhanced or improved by having a three-dimensional optical train. Configuring the optical train from two-dimensional to three-dimensional enhances the spectral purity of the radiation beam as the reflection coefficient, although substantially unchanged in the EUV region, is reduced in other regions of the electromagnetic spectrum. For example, in about the 1000 nm region, the reflection coefficient for a three-dimensional optical train is significantly less than that of a two-dimensional optical train. The proportion of EUV radiation in a reflected beam may therefore increase in a three-dimensional optical train. A substantial proportion of EUV radiation may be reflected at a certain angle whereas undesired radiation such as IR radiation may be absorbed, substantially absorbed, deflected or refracted in other directions.

The lithographic apparatus may include two grazing incidence mirrors. The first grazing incidence mirror may be in a source-collector module of the lithographic apparatus and may be referred to as a grating spectral purity filter. The second grazing incidence mirror may be in the illumination system of the lithographic apparatus and may be the final mirror in the illumination system.

The optical train may be configured to be three-dimensional by, for example, rotating a combination of a collector, a source and a first grazing incidence mirror. The collector or source may be rotated around an optical axis that rotates an intermediate focus of the radiation beam by, for example, +90 or −90°.

Alternatively, in a further embodiment the spectral purity of the radiation beam may be enhanced by introducing a further grazing incidence mirror in the intermediate focus of the lithographic apparatus. The optical axis may be substantially in the reflecting surface of the further grazing incidence mirror at the position of the intermediate focus. This further grazing incidence mirror may act as a first and second mirror, depending on the other grazing incidence mirrors in the lithographic apparatus. The further grazing incidence mirror in the intermediate focus may be used in combination with a grazing incidence mirror in the source-collector module, the illumination system or the projection system. The further grazing incidence mirror in the intermediate focus in combination with a grazing incidence mirror in the source-collector module of the lithographic apparatus or, alternatively, a grazing incidence mirror in the illumination system forms a three-dimensional optical train. The three-dimensional optical train enhances the spectral purity of the beam. The grazing incidence mirror in the intermediate focus may image the intermediate focus onto itself, resulting in the radiation beam being unchanged.

The further grazing mirror in the intermediate focus may be two-sided. When the grazing incidence mirror is in the focus of the collector, the grazing incidence mirror may be two-sided. The grazing incidence mirror may be as thin as possible in order to have both reflecting layers as close to the optical axis as possible. The grazing incidence mirror may have a thickness less than about 1,000 μm, less than about 500 μm, or less than about 100 μm.

In a yet further embodiment, an additional mirror may be added in the source-collector module which in combination with a further grazing incidence mirror in the illumination system enhances the spectral purity.

The grazing incidence mirrors may have reflective surfaces including any of the following: Ru, Rh, Pd, Mo, Nb, Au, Zr and Tc, or any combination thereof. The reflective surface may have a thickness of about 1-1,000 nm, or about 10-100 nm. The grazing incidence mirror may be a ruthenium grazing incidence mirror. For 13.5 nm radiation, the reflection of the grazing incidence mirror with a ruthenium surface may be higher than about 91% i.e. only 9% of the light may be lost.

The radiation used in the lithographic apparatus may have a wavelength corresponding to that of Extreme Ultra-Violet radiation (EUV). The radiation used may have a wavelength of between about 5 nm and 20 nm, and about 13.5 nm.

According to a further embodiment, the lithographic apparatus may include two grazing incidence mirrors. The spectral purity may be enhanced by configuring the optical train of the lithographic apparatus to be three-dimensional. The optical train may be configured to be three-dimensional by, for example, rotating a combination of a collector, a source and a first grazing incidence mirror. A secondary grazing incidence mirror may be in the illumination system of the lithographic apparatus.

Alternatively, the spectral purity may be enhanced by having a grazing incidence mirror in the intermediate focus of the lithographic apparatus. Preferably, the spectral purity may be further enhanced by having the grazing incidence mirror in the intermediate focus being part of a three-dimensional optical train. Typically, the further grazing incidence mirror in the intermediate focus in combination with a grazing incidence mirror in the source-collector-module of the lithographic apparatus or alternatively a grazing incidence mirror in the illumination system forms a three-dimensional optical train. The three-dimensional optical train enhances the spectral purity of the beam.

In a yet further embodiment, an additional mirror may be added in the source-collector module which in combination with a further grazing incidence mirror in the illumination system may be used to enhance the spectral purity.

According to another aspect of the present invention a device manufacturing method includes providing a conditioned radiation beam using an illumination system; imparting a pattern to the radiation beam; and projecting the patterned beam or radiation onto a target portion of the substrate, wherein the radiation beam is reflected from at least one grazing incidence mirror which has the effect of enhancing the spectral purity of the radiation beam.

The spectral purity may be enhanced by configuring an optical train to be three-dimensional. The optical train may be configured to be three-dimensional by, for example, rotating a combination of a collector, a source and a first grazing incidence mirror. A second grazing incidence mirror may be in the illumination system.

Alternatively, the spectral purity may be enhanced by having a grazing incidence mirror in an intermediate focus. The spectral purity may be further enhanced by having the grazing incidence mirror in the intermediate focus being part of a three-dimensional optical train. The further grazing incidence mirror in the intermediate focus in combination with a grazing incidence mirror in the source-collector-module of the lithographic apparatus or alternatively a grazing incidence mirror in the illumination system forms a three-dimensional optical train. The three-dimensional optical train enhances the spectral purity of the beam.

In a yet further embodiment, an additional mirror may be added in the source-collector module which in combination with a further grazing incidence mirror in the illumination system may be used to enhance the spectral purity.

The radiation may be EUV radiation.

The manufactured device may, for example, be an integrated circuits (IC), integrated optical system, guidance and detection pattern for magnetic domain memories, a liquid crystal display (LCDs) or a thin-film magnetic head.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
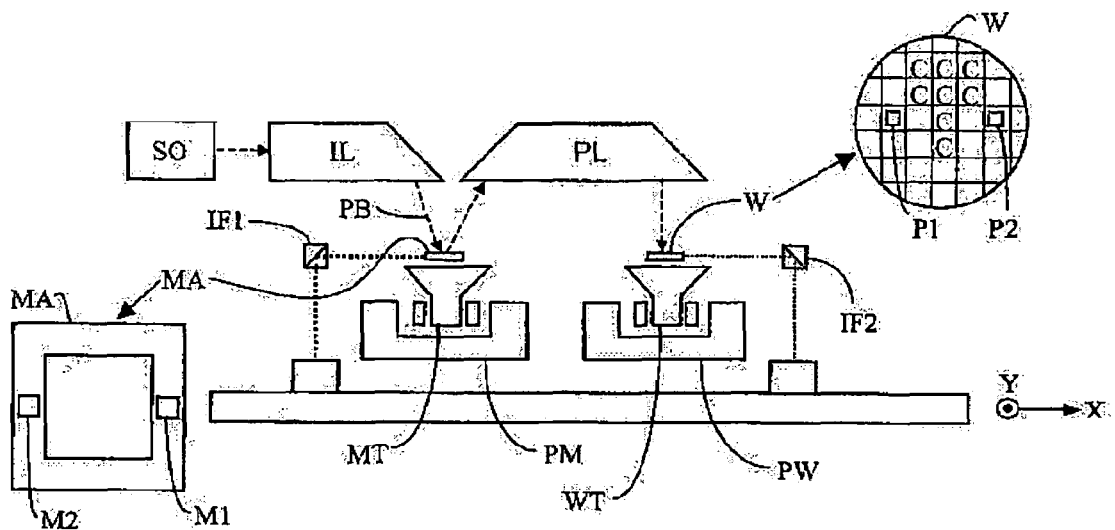
FIG. 1 depicts a lithographic apparatus according to an embodiment of the present invention.

FIG. 1 schematically depicts a lithographic apparatus according to an embodiment of the present invention. The apparatus includes an illumination system (illuminator) IL configured to condition a radiation beam PB (e.g. UV radiation or EUV radiation). A support (e.g. a mask table) MT is consfigured to support a patterning device (e.g. a mask) MA and is connected to a first positioning device PM configured to accurately position the patterning device in accordance with certain parameters A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PL is configured to project a pattern imparted to the radiation beam PB by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between, for example, the projection system and the substrate during exposure.

Referring to FIG. 1, the illuminator IL receives a radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp.

The source SO and the illuminator IL, together with the beam delivery system, if required, may be referred to as a radiation system.

The illuminator IL may include an adjusting device for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam PB is incident on the patterning device (e.g., mask MA), which is held on the support (e.g., mask table MT), and is patterned by the patterning device. Having traversed the mask MA, the radiation beam PB passes through the projection system PL, which focuses the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam PB. Similarly, the first positioning device PM and another position sensor IF1 (e.g. an interferometrice device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions. Such marks are known as scribe-lane alignment marks. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
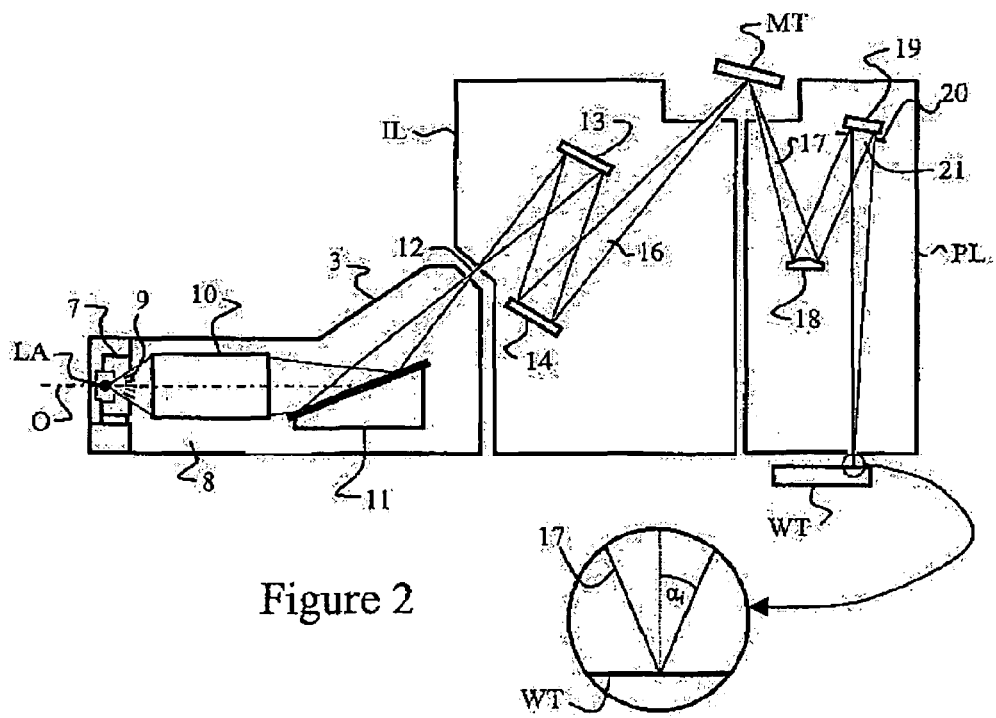
FIG. 2 depicts a lithographic apparatus for use with Extreme Ultra-Violet (EUV) radiation according to an embodiment of the present invention.

FIG. 2 shows a side view of an EUV lithographic apparatus in accordance with an embodiment of the invention. It will be noted that, although the arrangement is different to that of the apparatus shown in FIG. 1, the principle of operation is similar. The apparatus includes a source-collector-module or radiation unit 3, an illumination system IL and a projection system PL. Radiation unit 3 is provided with a radiation source LA which may employ a gas or vapor, such as for example Xe gas or Li vapor in which a very hot discharge plasma is created so as to emit radiation in the EUV range of the electromagnetic radiation spectrum. The discharge plasma is created by causing a partially ionized plasma of an electrical discharge to collapse onto the optical axis O. Partial pressures of 0.1 m bar of Xe, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure includes a channel structure such as, for instance, described in detail in U.S. Pat. Nos. 6,614,505 and 6,359,969, which are incorporated herein by reference. The collector chamber 8 includes a radiation collector 10 which is formed, for example, by a grazing incidence collector. Radiation passed by collector 10 is reflected from a grating spectral purity filter 11 to be focused in a virtual source point 12 (i.e. an intermediate focus) and an aperture in the collection chamber 8. From chamber 8, the radiation beam 16 is reflected in illumination system IL via normal incidence reflectors 13,14 onto a reticle or mask positioned on reticle or masked table MT. A patterned beam 17 is formed which is imaged by projection system PL via reflective elements 18,19 onto wafer stage or substrate table WT. More elements than shown may generally be present in the illumination system IL and projection system PL.

One of the reflective elements 19 has in front of it an NA disc 20 having an aperture 21 therethrough. The size of the aperture 21 determines the angle αi subtended by the radiation beam 17 as it strikes the substrate table WT.

Figure 3:
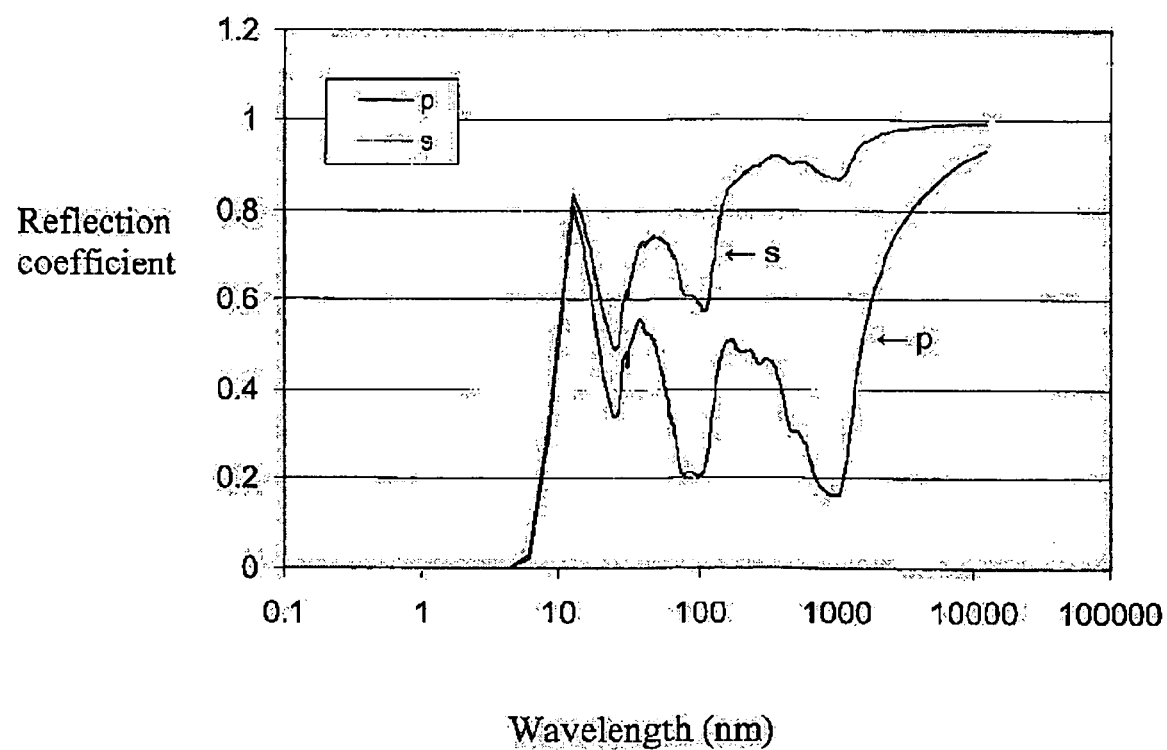
FIG. 3 depicts a graph of reflection coefficient versus wavelength for s- and p-polarized light reflected from a ruthenium coated grazing incidence mirror.

FIG. 3 is a graph of reflection coefficient versus wavelength for a ruthenium grazing incidence mirror. The grazing incidence mirror is irradiated at an angle of incidence of 15o with respect to the surface. FIG. 3 shows two separate plots for s- and p- polarized light as a function of the wavelength.

As grazing incidence mirrors show significant polarization dependence in their reflection coefficient, this effect can be used for increasing the spectral purity of a radiation beam for EUV lithography. Therefore, by choosing the proper orientation of grazing incidence mirrors, the spectral purity can be enhanced.

It is clear from FIG. 3 that the difference for s- and p-polarized light is large, except for the EUV region such as between about 5 and 20 nm. Since EUV sources in general produce unpolarized light, half of the light is reflected as p- and half as s-polarized light.

Figure 4A:
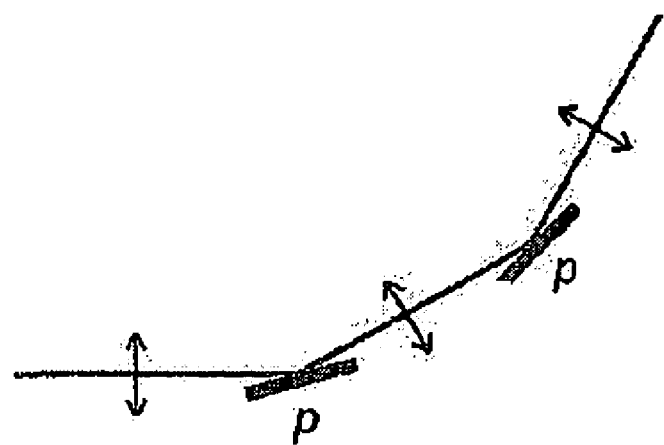
FIGS. 4a and 4b depict a two- and three-dimensional optical train for s- and p-polarized light.
Figure 4B:
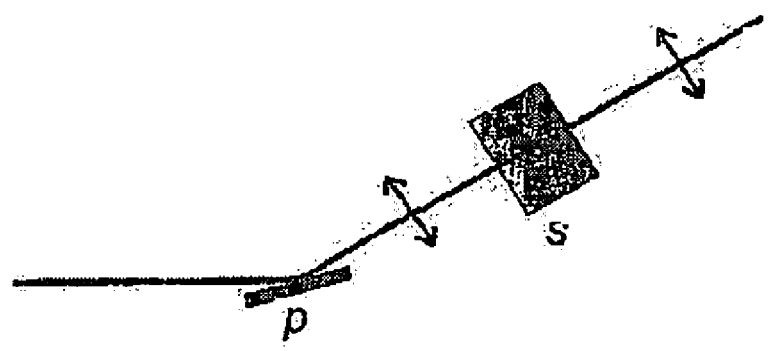

FIGS. 4a and 4b show a two-dimensional and a three-dimensional optical train, respectively. In the two-dimensional optical train shown in FIG. 4a, a second grazing incidence reflection reflects the part which was previously reflected as p- again as p-polarized light. The same holds for s-polarized light. The result is that the transmission t of the two mirror reflections in a two-dimensional optical train is:

$$t_{2d} = \frac{1}{2}r_p^2 + \frac{1}{2}r_s^2$$

For the three-dimensional optical train, as shown in FIG. 4b, the resulting transmission t is:

$$t_{3d} = \frac{1}{2}r_p \cdot r_s + \frac{1}{2}r_s \cdot r_p = r_s \cdot r_p$$

Figure 6:
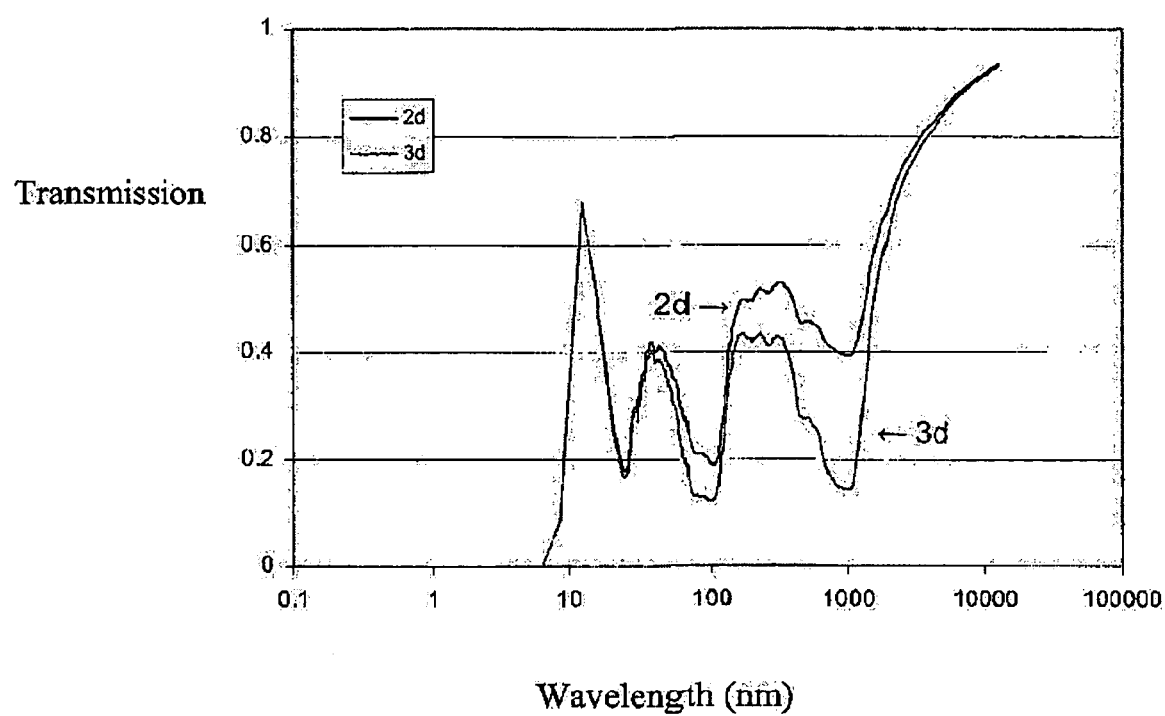
FIG. 6 depicts a graph of transmission versus wavelength for a two- and three-dimensional optical train.

The transmissions for two-dimensional and three-dimensional optical trains are shown in FIG. 6. FIG. 6 clearly shows that for the EUV-region, there is no significant difference between the two- and three-dimensional transmission values. However, there are regions where differences occur such as around 1000 nm where the transmission curves deviate significantly. This feature can be used to increase spectral purity.

Figure 5:
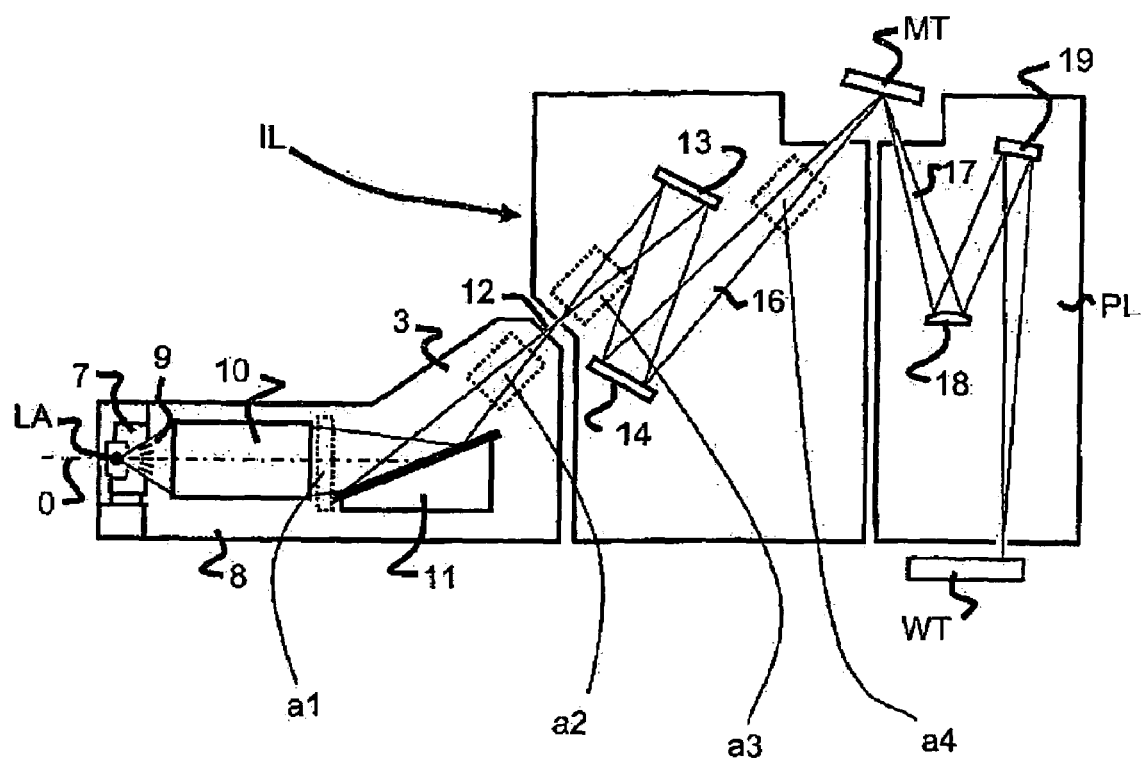
FIG. 5 depicts a lithographic apparatus for use with Extreme Ultra-Violet (EUV) radiation according to an embodiment of the present invention wherein the location of grazing incidence mirrors is identified.

FIG. 5 represents different positions for grazing incidence mirrors in a number of different potential embodiments. The different positions for the grazing incidence mirrors are identified as a1-a4. The different embodiments are discussed below.

The optical train of the EUV apparatus according to a first embodiment of the present invention has two grazing incidence mirrors including ruthenium reflecting layers. The first grazing incidence mirror is present in the source-collector-module/radiation unit 3 and is represented by reference numeral 11 in FIG. 5 and is known as a grating spectral purity filter. The second grazing incidence mirror is in the illuminator (IL) and may be either a grazing incidence mirror at position a3 or a4.

The design of the EUV apparatus shown in FIG. 5 is two-dimensional, except for the radiation collector 10. By configuring the optical train of the EUV lithographic apparatus into a three-dimensional arrangement, by for example rotating the source-collector-module 8 around a line from the middle of mirror 13 to through the intermediate focus 12 over 90°, the mirror 11 and either a mirror at position a3 or a4 are in a three-dimensional arrangement. This enhances spectral purity.

FIG. 6 shows that for a three-dimensional arrangement, although the transmission is unchanged in the EUV region, the transmission is significantly reduced in other regions of the spectrum. This means that the proportion of the EUV transmission in the radiation beam is increased, therefore leading to enhanced spectral purity. In effect, this may be seen as providing a projection beam with less noise and a greater ratio of EUV radiation.

Figure 7:
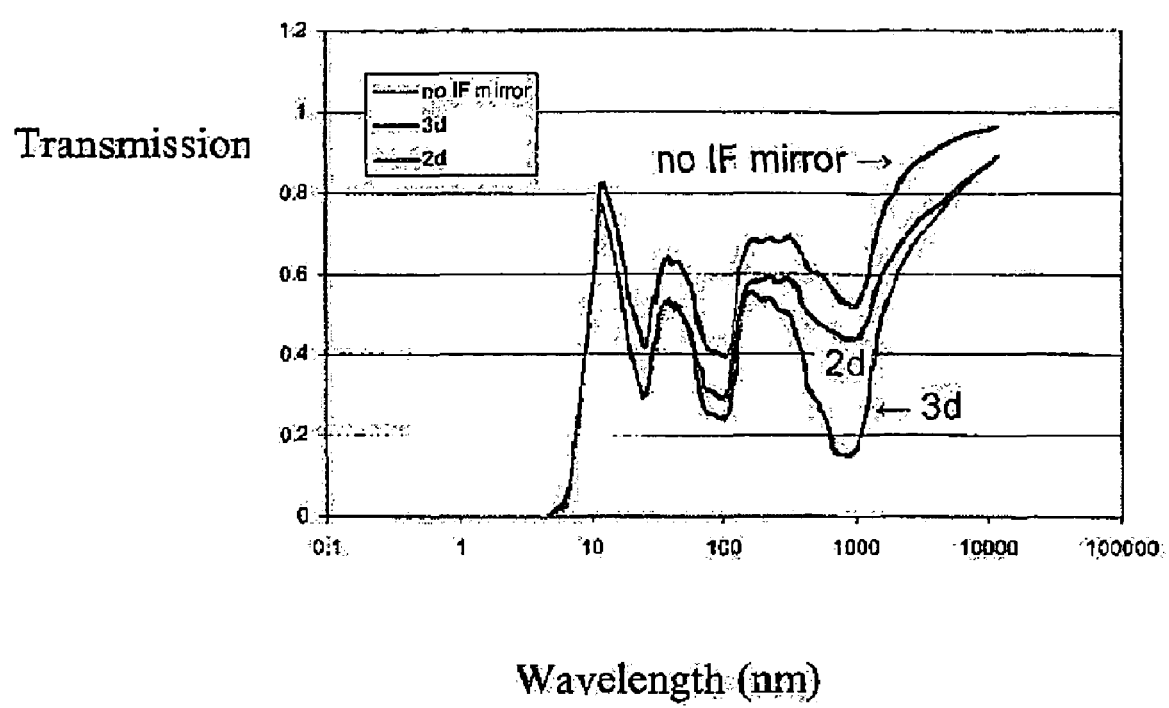
FIG. 7 depicts a graph of transmission versus wavelength for a two- and three-dimensional optical system along with a comparison to a system without a grazing mirror in the intermediate focus.

FIG. 7 relates to a second embodiment of the present invention wherein a further grazing incidence mirror is added to the system shown in FIG. 5. The further grazing incidence is introduced in the intermediate focus 12 of the lithographic apparatus shown in FIG. 5. The mirror positioned at the intermediate focus 12 is a double sided mirror which is in the plane of the drawing shown in FIG. 5. The combination of mirror 11 and the mirror at the intermediate focus 12 has a three-dimensional orientation. When a mirror at position a3 and a4 has the same orientation mirror 11 (i.e. substantially perpendicular to plane of the drawing) then a combination of a mirror at either a3 or a4 with the additional mirror at the intermediate focus 12 has a three-dimensional orientation.

FIG. 7 shows the transmission of systems consisting of a first ruthenium grazing incidence mirror at 15° (maximum angle at the spectral purity replacement mirror), and a second ruthenium grazing incidence mirror at 6° (half the top-angle of the cone) at the intermediate focus. Transmissions are measured with the orientation of the grazing incidence mirrors in both two-dimensional and three-dimensional configurations. There is also a comparison to a system without a grazing incidence mirror in the intermediate focus.

The orientation of the second grazing incidence mirror is such that the optical axis is in the mirror surface. This means that the second grazing incidence mirror images the intermediate focus onto itself, resulting in no changes in the radiation beam outline. By using ruthenium, the reflection of the mirror for 13.5 nm radiation will be higher than 91% i.e. only 9% of the light is lost.

The second grazing incidence mirror is also two-sided. This means that the mirror has a thickness such as about 10-100 nm in order to have both reflecting layers as close to the optical axis as possible. The thickness of the substrate of the mirror is very thin, with the optical coating being even thinner i.e. the substrate mainly determines the total thickness.

FIG. 7 shows that for three-dimensional optical systems the transmission of radiation outwith that of EUV radiation is less than that of two-dimensional optical systems. For example, there is a significant reduction in infrared radiation for a three-dimensional optical train in comparison with that of a two-dimensional optical train. FIG. 7 also shows that improved results are obtained when there is a mirror in the intermediate focus.

The spectral purity of a beam will therefore be enhanced by using an optical system which has a grazing incidence mirror in the intermediate focus which is part of a three-dimensional optical train.

In a further embodiment, rather than rotating the source-collector-module/radiation unit 3, a further mirror at position a1 or a2 is added which in combination with either mirror 11, a3 or a4 at the correct orientation enhances spectral purity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciatee that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the invention may be practiced otherwise than as described. For example, the present invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be appreciated that modifications may be made to the invention as described without departing from the scope of the claims set out below.

What is claimed is:

1. A lithographic apparatus, comprising:
a grazing incidence mirror configured to reflect a radiation beam to enhance a spectral purity of the radiation beam;
an illumination system configured to condition the radiation beam;
a support configured to support a patterning device, the patterning device being configured to impart the conditioned radiation beam with a pattern in its cross-section to form a patterned radiation beam;
a substrate table configured to hold a substrate; and
a projection system configured to project the patterned radiation beam onto a target portion of the substrate, wherein a first grazing incidence mirror is situated in a source-collector-module of the lithographic apparatus, a second grazing incidence mirror is situated in the illumination system of the lithographic apparatus and a third grazing incidence mirror in an intermediate focus of the lithographic apparatus.

2. A lithographic apparatus according to claim 1, wherein enhancing the spectral purity increases the proportion of EUV radiation in the radiation beam.

3. A lithographic apparatus according to claim 1, wherein the lithographic apparatus has an optical train and the spectral purity of the radiation beam is enhanced by configuring the optical train to be three-dimensional.

4. A lithographic apparatus according to claim 3, wherein the optical train is configured to be three-dimensional by rotating the source-collector-module in the lithographic apparatus.

5. A lithographic apparatus according to claim 1, wherein the source-collector-module is configured to be rotated so that the first and second grazing incidence mirrors are in a three-dimensional arrangement.

6. A lithographic apparatus according to claim 1, wherein the third grazing incidence mirror in the intermediate focus has an optical axis and a reflecting surface, and the optical axis is substantially in the reflecting surface.

7. A lithographic apparatus according to claim 1, wherein the third grazing incidence mirror in the intermediate focus forms part of a three-dimensional optical train with the second grazing incidence mirror in the illumination system.

8. A lithographic apparatus according to claim 1, wherein the radiation has a wavelength of between about 5 nm and about 20 nm.

9. A lithographic apparatus according to claim 1, wherein the radiation has a wavelength of about 13.5 nm.

10. A device manufacturing method, comprising:
conditioning radiation beam using an illumination system;
imparting a pattern to the radiation beam;
projecting the patterned beam or radiation onto a target portion of a substrate, and reflecting the radiation beam from at least grazing incidence mirror that enhances the spectral purity of the radiation beam, wherein a first grazing incidence mirror is situated in a source-collector-module of a lithographic apparatus, a second grazing incidence mirror is situated in the illumination system of the lithographic apparatus and a third grazing incidence mirror in an intermediate focus.

11. A device manufacturing method according to claim 10, wherein the spectral purity is enhanced by configuring an optical train of the lithographic apparatus to be three-dimensional.

12. A device manufacturing method according to claim 10, wherein an optical train is configured to be three-dimensional by rotating the source-collector-module.

13. A device manufacturing method according to claim 10, wherein the source-collector-module is rotated so that the first and second grazing incidence mirrors are in three-dimensional arrangement.

14. A device manufacturing method according to claim 10, wherein the third grazing incidence mirror in the intermediate focus has an optical axis and a reflecting surface, and the optical axis is substantially in the reflecting surface.

15. A device manufacturing method according to claim 10, wherein the third grazing incidence mirror in the intermediate focus is part of a three-dimensional optical train.

16. A device manufacturing method according to claim 15, wherein the third grazing incidence mirror in the intermediate focus forms part of a three-dimensional optical train with the second grazing incidence mirror in the illumination system.

17. A device manufacturing method, comprising:
projecting a patterned beam of radiation onto a substrate, wherein the radiation beam is reflected from at least one grazing incidence mirror that enhances the spectral purity of the radiation beam, wherein a first grazing incidence mirror is situated in a source-collector-module of a lithographic apparatus, a second grazing incidence mirror is situated in an illumination system of the lithographic apparatus and a third grazing incidence mirror in an intermediate focus.

18. A device manufacturing method according to claim 17, wherein the spectral purity is enhanced by configuring an optical train of the lithographic apparatus to be three-dimensional.

19. A device manufacturing method according to claim 17, wherein an optical train is configured to be three-dimensional by rotating the source-collector-module.

20. A device manufacturing method according to claim 17, wherein the source-collector-module is rotated so that the first and second grazing incidence mirrors are in a three-dimensional arrangement.

21. A device manufacturing method according to claim 17, wherein the third grazing incidence mirror in the intermediate focus has an optical axis and a reflecting surface, and the optical axis is substantially in the reflecting surface.

22. A device manufacturing method according to claim 17, wherein the third grazing incidence mirror in the intermediate focus is part of a three-dimensional optical train.

23. A device manufacturing method according to claim 22, wherein the third grazing incidence mirror in the intermediate focus forms part of a three-dimensional optical train with the second grazing incidence mirror in the illumination system.

24. A device manufacturing method, comprising:
providing a radiation beam using an illumination system;
imparting a pattern to the radiation beam;
projecting the pattern radiation beam onto a substrate; and
reflecting the radiation beam from at least one grazing incidence mirror that enhances the spectral purity of the radiation beam, wherein a first grazing incidence mirror is situated in a source-collector-module of a lithographic apparatus, a second grazing incidence mirror is situated in the illumination system of the lithographic apparatus and a third grazing incidence mirror in an intermediate focus.

25. A device manufacturing method according to claim 24, wherein the spectral purity is enhanced by configuring an optical train of the lithographic apparatus to be three-dimensional.

26. A device manufacturing method according to claim 24, wherein an optical train is configured to be three-dimensional by rotating the source-collector-module.

27. A device manufacturing method according to claim 24, wherein the source-collector-module is rotated so that the first and second grazing incidence mirrors are in a three-dimensional arrangement.

28. A device manufacturing method according to claim 24, wherein the third grazing incidence mirror in the intermediate focus has an optical axis and a reflecting surface, and the optical axis is substantially in the reflecting surface.

29. A device manufacturing method according to claim 24, wherein the third grazing incidence mirror in the intermediate focus is part of a three-dimensional optical train.

30. A device manufacturing method according to claim 29, wherein the third grazing incidence mirror in the intermediate focus forms part of a three-dimensional optical train with the second grazing incidence mirror in the illumination system.

* * * * *